United States Patent
Murayama

(10) Patent No.: US 7,911,048 B2
(45) Date of Patent: Mar. 22, 2011

(54) WIRING SUBSTRATE

(75) Inventor: Kei Murayama, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 60 days.

(21) Appl. No.: 12/142,039

(22) Filed: Jun. 19, 2008

(65) Prior Publication Data

US 2008/0315367 A1 Dec. 25, 2008

(30) Foreign Application Priority Data

Jun. 22, 2007 (JP) ................................ 2007-165464

(51) Int. Cl.
*H01L 23/13* (2006.01)

(52) U.S. Cl. ........ 257/693; 257/621; 257/673; 257/676; 257/758; 257/781; 257/E23.061

(58) Field of Classification Search .................. 257/621, 257/673, 676, 758, 781, E23.061
See application file for complete search history.

(56) References Cited

U.S. PATENT DOCUMENTS

| 6,521,970 | B1 * | 2/2003 | Takiar et al. ................... 257/522 |
| 2005/0020052 | A1 * | 1/2005 | Lee et al. ....................... 438/613 |
| 2007/0029654 | A1 * | 2/2007 | Sunohara et al. ............. 257/678 |

FOREIGN PATENT DOCUMENTS

JP 2007-042741 2/2007

* cited by examiner

*Primary Examiner* — Kiesha R Bryant
*Assistant Examiner* — Minchul Yang
(74) *Attorney, Agent, or Firm* — Drinker Biddle & Reath LLP

(57) ABSTRACT

There is provided a wiring substrate. The wiring substrate includes: a semiconductor substrate having a through hole; an insulating film provided to cover an upper surface, a lower surface and a first surface of the semiconductor substrate, the first surface corresponding to a side surface of the through hole; a through electrode provided in the through hole; a first wiring pattern disposed on an upper surface side of the semiconductor substrate and coupled to the through electrode; and a second wiring pattern disposed on a lower surface side of the semiconductor substrate and coupled to the through electrode. A first air gap is provided between the first wiring pattern and the insulating film formed on the upper surface, and a second air gap is provided between the second wiring pattern and the insulating film formed on the lower surface.

9 Claims, 17 Drawing Sheets

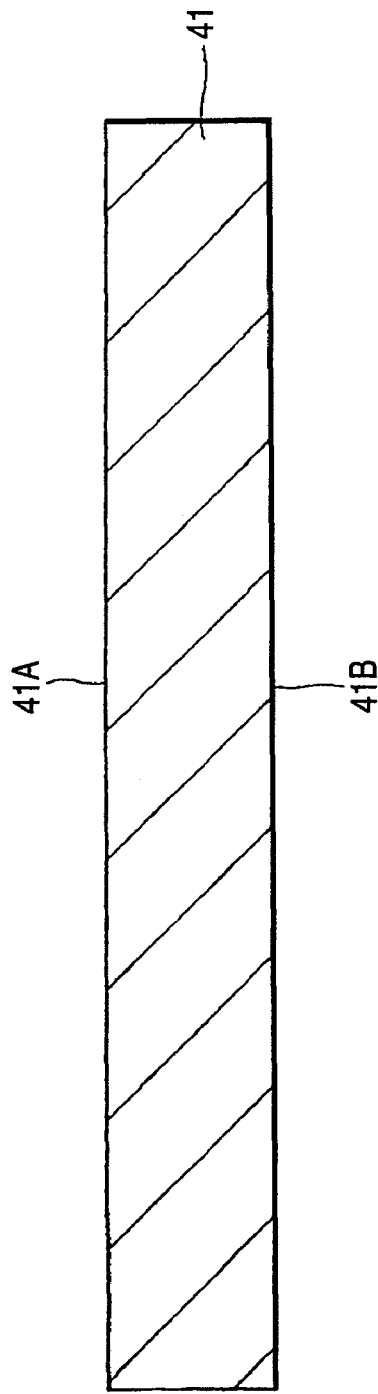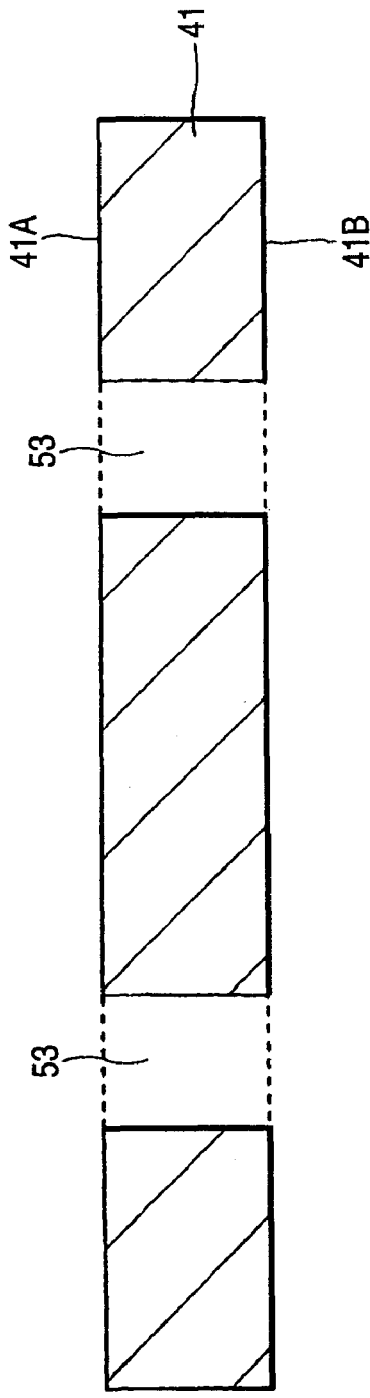

US 7,911,048 B2

WIRING SUBSTRATE

This application is based on and claims priority from Japanese Patent Application No. 2007-165464, filed on Jun. 22, 2007, the entire contents of which are hereby incorporated by reference.

BACKGROUND

1. Technical Field

The present disclosure relates to a wiring substrate including an insulating film for covering an upper surface and a lower surface of a semiconductor substrate, a first wiring pattern disposed on an upper surface side of the semiconductor substrate and coupled to a through electrode and an electronic component, and a second wiring pattern disposed on a lower surface side of the semiconductor substrate and coupled to the through electrode and a mounting substrate.

2. Related Art

In the related art, as the wiring substrate (interposer) for connecting electrically the semiconductor chip and the mounting substrate such as the motherboard, a wiring substrate 200 shown in FIG. 1 is used.

FIG. 1 is a sectional view of a wiring substrate in the related art.

By reference to FIG. 1, the wiring substrate 200 includes a semiconductor substrate 206 as a base material, an insulating film 207, through electrodes 208, and first and second wirings 211, 212.

The semiconductor substrate 206 is a substrate shaped like a plate, and has through holes 215. As the semiconductor substrate 206, for example, a silicon substrate can be used. The insulating film 207 is formed to cover an upper surface 206A and a lower surface 206B of the semiconductor substrate 206 and surfaces of the semiconductor substrate 206, which are exposed from the through holes 215. A dielectric constant of the insulating film 207 is larger than a dielectric constant 1.0 of the air and is about 3.8.

The through electrodes 208 are provided in the through holes 215 on which the insulating film 207 is formed. The through electrodes 208 are used to connect electrically the first wiring 211 and the second wiring 212. As the material of the through electrodes 208, for example, Cu can be used.

The first wiring 211 is provided to extend over the insulating film 207 that is formed from upper end portions of the through electrodes 208 to the upper surface 206A of the semiconductor substrate 206. The first wiring 211 is a wiring to which an electronic component 201 is connected (mounted). As the electronic component 201, the semiconductor chip whose base material is formed of the silicon substrate can be used.

The second wiring 212 is provided to extend over the lower surface of the insulating film 207 that is formed from lower end portions of the through electrodes 208 to the lower surface 206B of the semiconductor substrate 206. The second wiring 212 is a wiring that is connected electrically to pads 203 of a mounting substrate 202 (concretely, the motherboard, for example). As the material of the base member of the mounting substrate 202, a resin can be used (see e.g., JP-A-2007-42741).

However, in the wiring substrate 200 in the related art, the first and second wirings 211, 212 contact the insulating film 207. Therefore, there is a problem that a transmission speed of a signal transmitted between the electronic component 201 connected to the first wiring 211 and the mounting substrate 202 connected electrically to the second wiring 212 cannot be increased.

Also, a material of the base member (concretely, silicon) of the wiring substrate 200 is different from that of the base member (concretely, resin) of the mounting substrate 202. Therefore, there is a problem that reliability of electrical connection between the wiring substrate 200 and the mounting substrate 202 is decreased on account of a difference of coefficient of thermal expansion between the wiring substrate 200 and the mounting substrate 202.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide a wiring substrate capable of improving a transmission speed of a signal transmitted between an electronic component and a mounting substrate and capable of improving reliability of electrical connection between the wiring substrate and the mounting substrate.

According to one or more aspects of the present invention, there is provided a wiring substrate. The wiring substrate includes: a semiconductor substrate having a through hole; an insulating film provided to cover an upper surface, a lower surface and a first surface of the semiconductor substrate, the first surface corresponding to a side surface of the through hole; a through electrode provided in the through hole; a first wiring pattern disposed on an upper surface side of the semiconductor substrate and coupled to the through electrode; and a second wiring pattern disposed on a lower surface side of the semiconductor substrate and coupled to the through electrode. A first air gap is provided between the first wiring pattern and the insulating film formed on the upper surface, and a second air gap is provided between the second wiring pattern and the insulating film formed on the lower surface.

According to one or more aspects of the present invention, there is provided a semiconductor device including the wiring substrate, and an electronic component coupled to the first wiring pattern.

According to one or more aspects of the present invention, in a method of manufacturing a wiring substrate, the method includes: i) preparing a semiconductor substrate; ii) forming a through hole in the semiconductor substrate; iii) forming an insulating film on an upper surface, a lower surface and a first surface of the semiconductor substrate, the first surface corresponding to a side surface of the through hole; iv) providing a through electrode in the trough hole; v) forming a first wiring pattern on the insulating film formed on the upper surface such that the first wiring pattern is coupled to the through electrode; vi) forming a second wiring pattern on the insulting film formed on the lower surface such that the second wiring pattern is coupled to the through electrode; vii) etching the insulating film formed on the upper surface, thereby forming an air gap between the first wiring pattern and the insulating film formed on the upper surface; and viii) etching the insulating film formed on the lower surface, thereby forming an air gap between the second wiring pattern and the insulating film formed on the lower surface.

Other aspects and advantages of the invention will be apparent from the following description, the drawings and the claims.

BRIEF DESCRIPTION OF THE DRAWINGS

The above and other aspects, features and advantages of the present invention will be more apparent from the following more particular description thereof, presented in conjunction with the following drawings wherein:

FIG. 10 is a view (#1) showing steps of manufacturing the wiring substrate according to the second embodiment of the present invention;

FIG. 11 is a view (#2) showing steps of manufacturing the wiring substrate according to the second embodiment of the present invention;

DETAILED DESCRIPTION

Exemplary embodiments of the present invention will be described with reference to the drawings hereinafter.

First Embodiment

Figure 1:
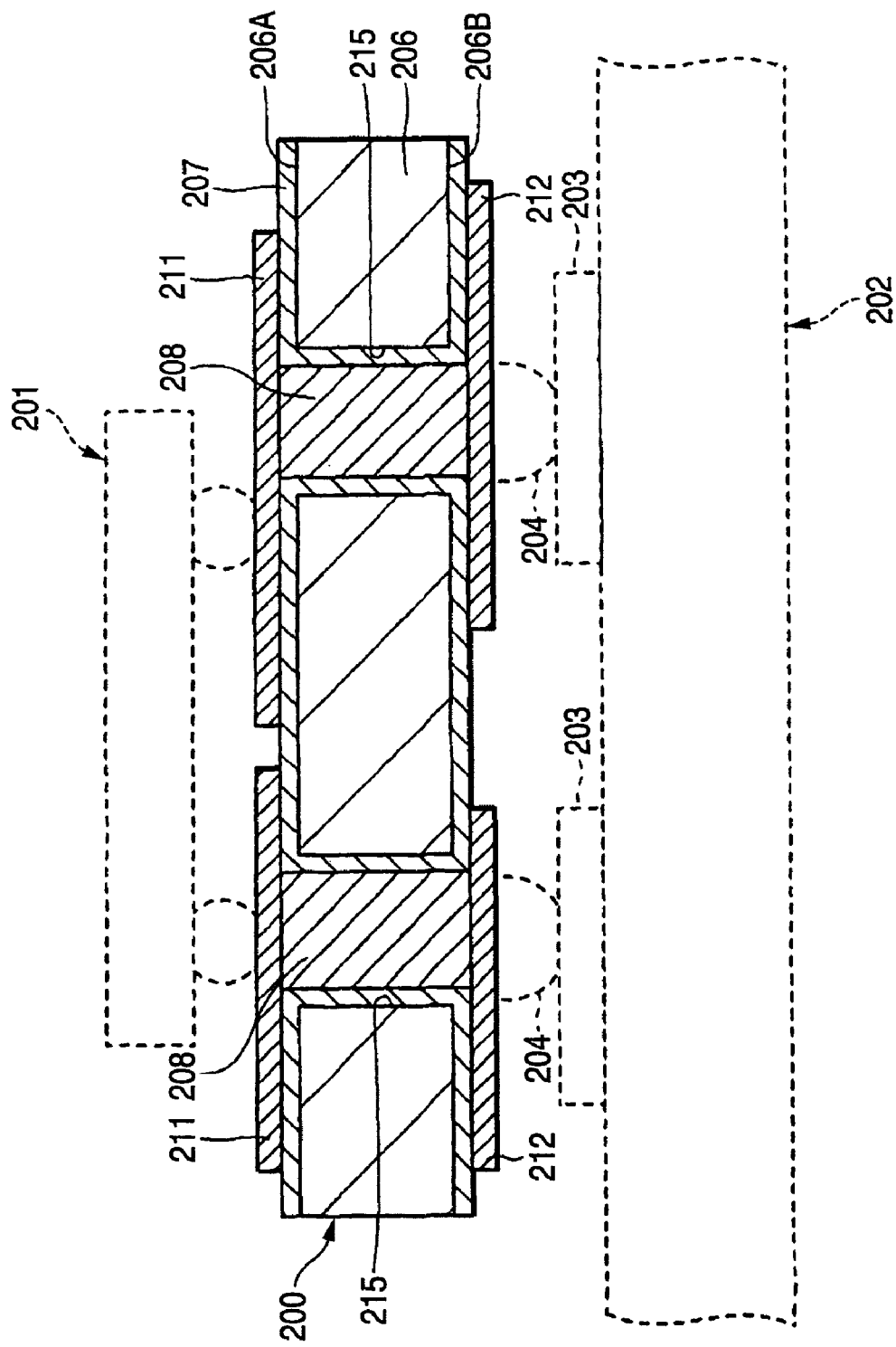
FIG. 1 is a sectional view of a wiring substrate in the related art.
Figure 2:
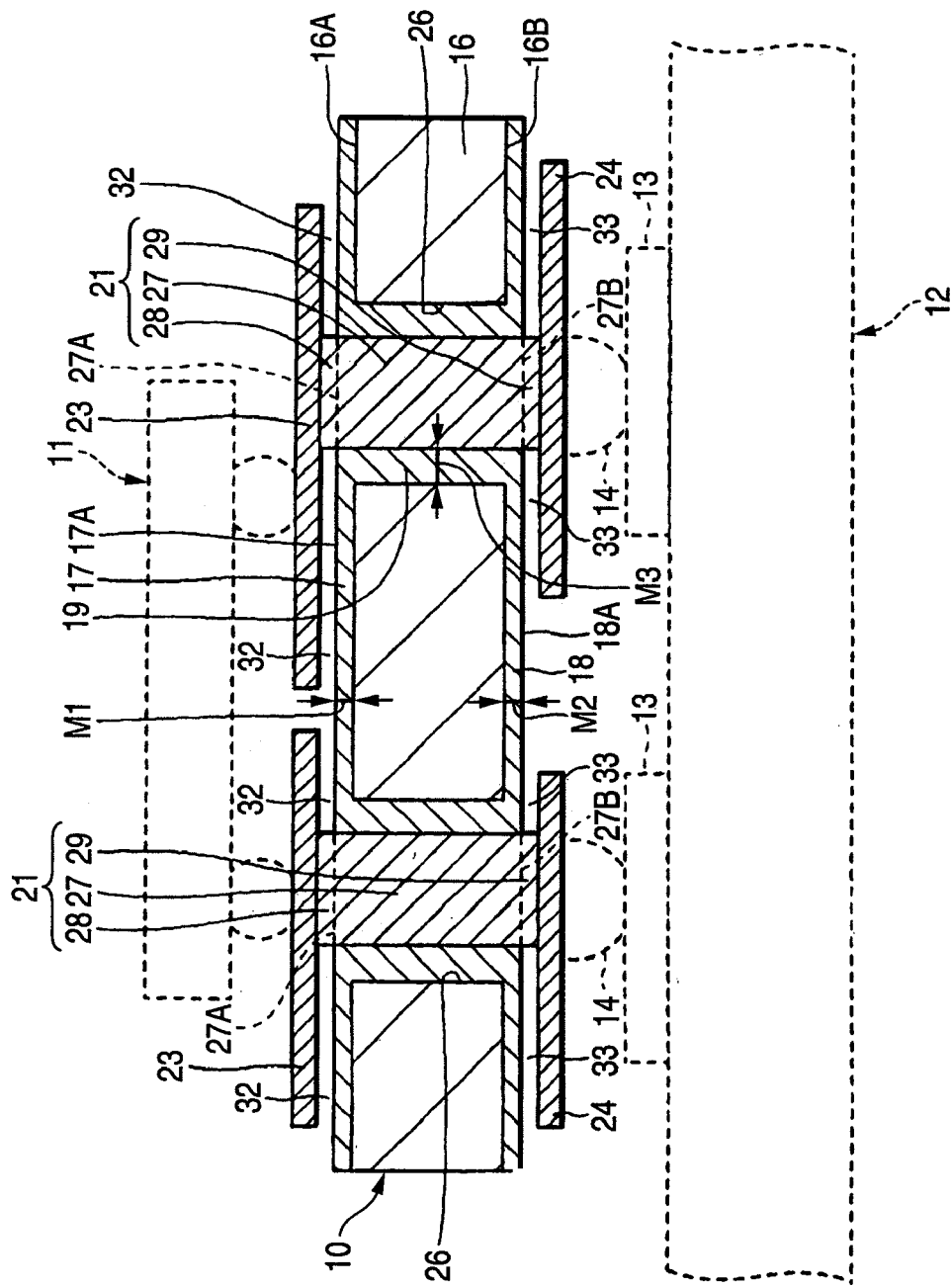
FIG. 2 is a sectional view of a wiring substrate according to a first embodiment of the present invention.

FIG. 2 is a sectional view of a wiring substrate according to a first embodiment of the present invention.

By reference to FIG. 2, a wiring substrate 10 of the first embodiment includes a semiconductor substrate 16, insulating films 17 to 19, through holes 21, first wiring patterns 23, and second wiring patterns 24.

The semiconductor substrate 16 is formed like a plate. The plurality of through holes 26 are formed in the semiconductor substrate 16. As the semiconductor substrate 16, a silicon substrate can be used, for example. When the silicon substrate is used as the semiconductor substrate 16, a thickness of the silicon substrate 16 can be set to 200 µm, for example.

The insulating film 16 is provided to cover an upper face 16A of the semiconductor substrate 16. When the silicon substrate is used as the semiconductor substrate 16, a thermal oxide film formed by thermally oxidizing the silicon substrate, for example, can be used as the insulating film 17. A thickness M1 of the insulating film 17 can be set to 1 µm, for example. A dielectric constant of the insulating film 17 is larger than a dielectric constant 1.0 of the air and is about 3.8.

The insulating film 18 is provided to cover a lower face 16B of the semiconductor substrate 16. When the silicon substrate is used as the semiconductor substrate 16, a thermal oxide film formed by thermally oxidizing the silicon substrate, for example, can be used as the insulating film 18. A thickness M2 of the insulating film 18 can be set to 1 µm, for example. A dielectric constant of the insulating film 18 is larger than a dielectric constant 1.0 of the air and is about 3.8.

The insulating film 19 is provided to cover surfaces of the semiconductor substrate 16, which are exposed from the through holes 26. The insulating film 19 is used to insulate a through electrode main body 27, as described below, and the semiconductor substrate 16. When the silicon substrate is used as the semiconductor substrate 16, a thermal oxide film formed by thermally oxidizing the silicon substrate, for example, can be used as the insulating film 19. A thickness M3 of the insulating film 19 can be set to 2 µm, for example.

The through electrode 21 is used to connect electrically the first wiring pattern 23 and the second wiring pattern 24. The through electrode 21 has the through electrode main body 27, a first projection portion 28, and a second projection portion 29. The through electrode main body 27 is provided in the through hole 26 on which the insulating film 19 is formed. An upper end surface 27A of the through electrode main body 27 is formed in the substantially same plane as an upper surface 17A of the insulating film 17. A lower end surface 27B of the through electrode main body 27 is formed in the substantially same plane as a lower surface 18A of the insulating film 18. As a material of the through electrode main body 27, for example, Cu can be used.

The first projection portion 28 is provided on the upper end surface 27A of the through electrode main body 27. The first projection portion 28 is formed integrally with the through electrode main body 27. The first projection portion 28 projects from the insulating film 17. The first wiring pattern 23 connected to an electronic component 11 (concretely, a semiconductor chip such as IC, LSI) is provided on the upper surface of the first projection portion 28. The first projection portion 28 is provided to form an air gap 32 (a first air gap) between the insulating film 17 and the first wiring pattern 23. A size of the air gap 32 can be set to 1 µm, for example. A thickness of the first projection portion 28 can be set to a value substantially equal to a value of the air gap 32. Concretely, when a size of the air gap 32 is 1 µm, a thickness of the first projection portion 28 can be set to 1 μm, for example. As the material of the first projection portion 28, for example, Cu can be used.

In this manner, the air gap 32 is formed between the insulating film 17 and the first wiring pattern 23 by providing the first projection portion 28, which projects from the insulating film 17, to the through electrode 21. Thus, an air whose dielectric constant (concretely, 1.0) is smaller than a dielectric constant (concretely, 3.8) of the insulating film 17 can be interposed between the insulating film 17 and the first wiring pattern 23. Therefore, a transmission speed of the signal transmitted between the electronic component 11 and a mounting substrate 12 can be improved.

The second projection portion 29 is provided on the lower end surface 27B of the through electrode main body 27. The second projection portion 29 is formed integrally with the through electrode main body 27. The second projection portion 29 projects from the insulating film 18. The second wiring pattern 24 connected to the mounting substrate 12 (concretely, the motherboard, for example) is provided on the lower surface of the second projection portion 29. The second projection portion 29 is provided to form a air gap 33 (a second air gap) between the insulating film 18 and the second wiring pattern 24. A size of the air gap 33 can be set to 1 μm, for example. A thickness of the second projection portion 29 can be set to a value substantially equal to a value of the air gap 33. Concretely, when a size of the air gap 33 is 1 μm, a thickness of the second projection portion 29 can be set to 1 μm, for example. As the material of the second projection portion 29, for example, Cu can be used.

In this manner, the air gap 33 is formed between the insulating film 18 and the second wiring pattern 24 by providing the second projection portion 29, which projects from the insulating film 18, to the through electrode 21. Thus, an air whose dielectric constant (concretely, 1.0) is smaller than a dielectric constant (concretely, 3.8) of the insulating film 18 can be interposed between the insulating film 18 and the second wiring pattern 24. Therefore, a transmission speed of the signal transmitted between the electronic component 11 and the mounting substrate 12 can be improved.

Also, the second wiring pattern 24 is positioned away from the insulating film 18 by providing the air gap 33 between the insulating film 18 and the second wiring pattern 24 to which the mounting substrate 12 is connected. Thus, a difference of coefficient of thermal expansion between the wiring substrate 10 and the mounting substrate 12 can be relaxed. Therefore, reliability of the electrical connection between the wiring substrate 10 and the mounting substrate 12 can be improved.

The first wiring pattern 23 is provided on the first projection portion 28 in a state that the air gap 32 is interposed between this first wiring pattern 23 and the insulating film 17 formed on the upper surface 16A of the semiconductor substrate 16. The first wiring pattern 23 is used to connect (mount) the electronic component 11. The first wiring pattern 23 is connected electrically to the second wiring pattern 24 via the through electrode 21. As the first wiring pattern 23, for example, a multilayer film constructed by forming sequentially a Ti film (e.g., thickness of 0.1 μm) formed by the sputter method, a Cu film (e.g., thickness of 0.5 μm) formed by the sputter method, a Cu film (e.g., thickness of 3.0 g/m) formed by the plating method, a Ni film (e.g., thickness of 3.0 μm) formed by the plating method, and an Au film (e.g., thickness of 0.5 μm) formed by the plating method on the first projection portion 28 can be used.

The second wiring pattern 24 is provided on the lower surface 16B of the semiconductor substrate 16 in a state that the air gap 33 is interposed between this second wiring pattern 24 and the insulating film 18 formed on the lower surface 16B of the semiconductor substrate 16. The second wiring pattern 24 is connected to a pad 13 provided to the mounting substrate 12 via an external connection terminal 14 (e.g., a solder bump), and also is connected electrically to the first wiring pattern 23 via the through electrode 21. As the second wiring pattern 24, for example, a multilayer film constructed by forming sequentially a Ti film (e.g., thickness of 0.1 μm) formed by the sputter method, a Cu film (e.g., thickness of 0.5 μm) formed by the sputter method, a Cu film (e.g., thickness of 3.0 μm) formed by the plating method, a Ni film (e.g., thickness of 3.0 μm) formed by the plating method, and an Au film (e.g., thickness of 0.5 μm) formed by the plating method on the lower surface of the second projection portion 29 can be used.

According to the wiring substrate of the present embodiment, the first wiring pattern 23 connected to the electronic component 11 is provided on the first projection portion 28, which projects from the insulating film 17 formed on the upper surface 16A of the semiconductor substrate 16, such that the air gap 32 is formed between the insulating film 17 and the first wiring pattern 23. Also, the second wiring pattern 24 connected electrically to the mounting substrate 12 is provided on the lower surface of the second projection portion 29, which projects from the insulating film 18 formed on the lower surface 16B of the semiconductor substrate 16, such that the air gap 33 is formed between the insulating film 18 and the second wiring pattern 24. Therefore, an air whose dielectric constant (concretely, 1.0) is smaller than a dielectric constant (concretely, 3.8) of the insulating films 17, 18 can be interposed between the insulating film 17 and the first wiring pattern 23 and between the insulating film 18 and the second wiring pattern 24 respectively. As a result, a transmission speed of the signal transmitted between the electronic component 11 and the mounting substrate 12 can be improved.

Also, the second wiring pattern 24 is positioned away from the insulating film 18 by providing the air gap 33 between the insulating film 18 and the second wiring pattern 24 to which the mounting substrate 12 is connected. Thus, a difference of coefficient of thermal expansion between the wiring substrate 10 and the mounting substrate 12 can be relaxed. Therefore, reliability of the electrical connection between the wiring substrate 10 and the mounting substrate 12 can be improved.

Also, the wiring substrate 10 of the present embodiment has been described in connection with the case where the air gap 32 is formed between the first wiring pattern 23 and the insulating film 17 and the air gap 33 is formed between the second wiring pattern 24 and the insulating film 18. Only any one air gap out of the air gaps 32, 33 may be formed. For example, when only the air gap 32 is formed, a transmission speed of the signal transmitted between the electronic component 11 and the mounting substrate 12 can be improved. Also, for example, when only the air gap 33 is formed, a transmission speed of the signal transmitted between the electronic component 11 and the mounting substrate 12 can be improved (this case is inferior in a degree of improvement to the case where both of the air gaps 32, 33 are formed) and also reliability of the electrical connection between the wiring substrate 10 and the mounting substrate 12 can be improved.

FIG. 3 to FIG. 8 are views showing steps of manufacturing the wiring substrate according to the first embodiment of the present invention. In FIG. 3 to FIG. 8, the same reference symbols are affixed to the same constituent portions as those of the wiring substrate 10 of the first embodiment.

Figure 3:
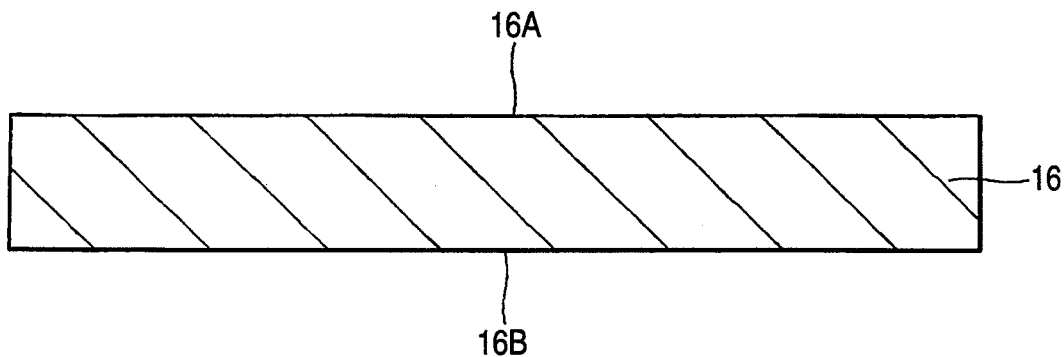
FIG. 3 is a view (#1) showing steps of manufacturing the wiring substrate according to the first embodiment of the present invention.

At first, in steps shown in FIG. 3, the semiconductor substrate 16 shaped like a plate is prepared. As the semiconductor substrate 16, for example, the silicon substrate can be used. When the silicon substrate is used as the semiconductor substrate 16, a thickness of the silicon substrate can be set to 200 µm, for example.

Figure 4:
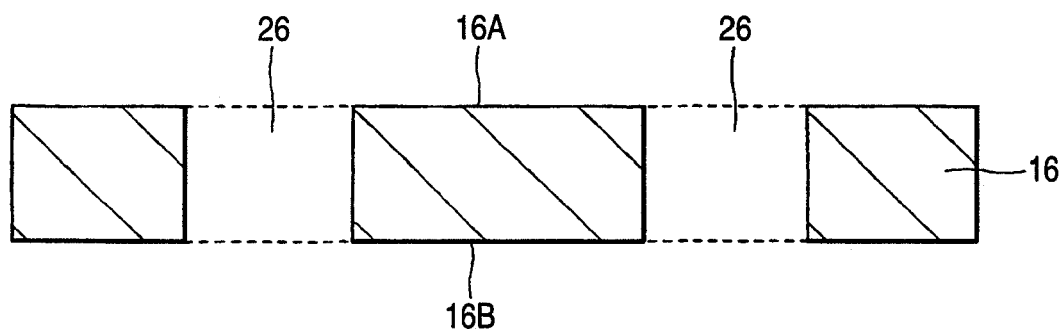
FIG. 4 is a view (#2) showing steps of manufacturing the wiring substrate according to the first embodiment of the present invention.

Then, in steps shown in FIG. 4, the through holes 26 passing through the semiconductor substrate 16 are formed. Concretely, the through holes 26 are formed by etching the semiconductor substrate 16 by means of the anisotropic etching, for example.

Figure 5:
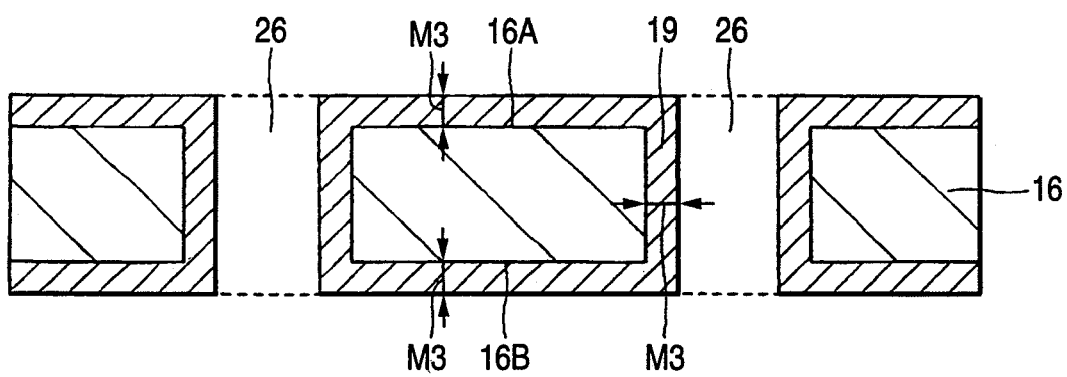
FIG. 5 is a view (#3) showing steps of manufacturing the wiring substrate according to the first embodiment of the present invention.

Then, in steps shown in FIG. 5, the insulating film 19 is formed to cover the upper surface 16A and the lower surface 16B of the semiconductor substrate 16 and the surfaces of the semiconductor substrate 16, which are exposed from the through holes 26. Concretely, when the silicon substrate is used as the semiconductor substrate 16, the insulating film 19 (in this case, the thermal oxide film) is formed by thermally oxidizing the semiconductor substrate 16, for example. In this event, the insulating film 19 formed on the upper surface 16A of the semiconductor substrate 16 constitutes the insulating film 17 (see FIG. 2) when this insulating film 19 is etched in the step described later and shown in FIG. 8. Also, the insulating film 19 formed on the lower surface 16B of the semiconductor substrate 16 constitutes the insulating film 18 (see FIG. 2) when this insulating film 19 is etched in the step described later and shown in FIG. 8. A thickness of the insulating film 19 can be set to 2 µm, for example.

Figure 6:
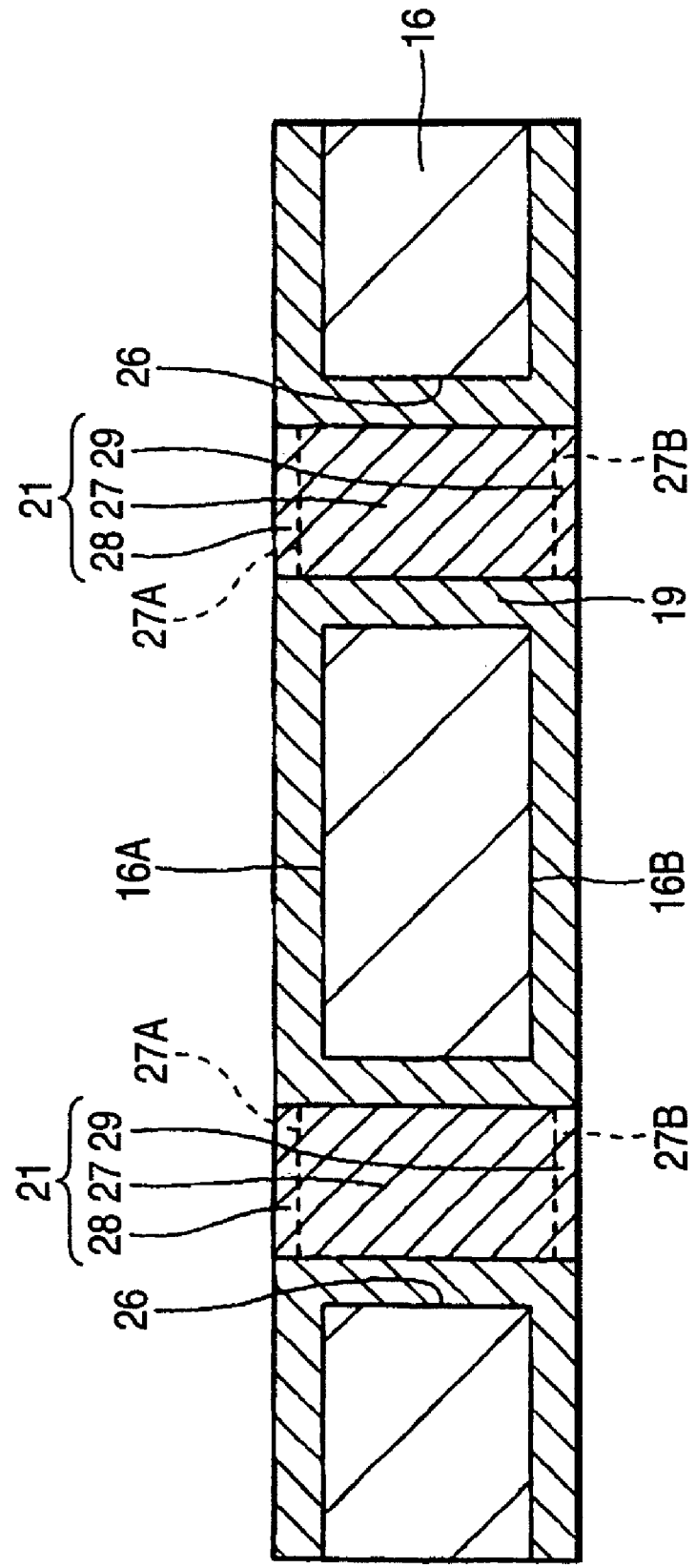
FIG. 6 is a view (#4) showing steps of manufacturing the wiring substrate according to the first embodiment of the present invention.

Then, in steps shown in FIG. 6, the through electrodes 21 each having the through electrode main body 27, the first projection portion 28, and the second projection portion 29 are formed. Concretely, the through electrodes 21 are formed by depositing/growing a Cu plating film in the through holes 26, on which the insulating film 19 is formed, by the plating method.

Figure 7:
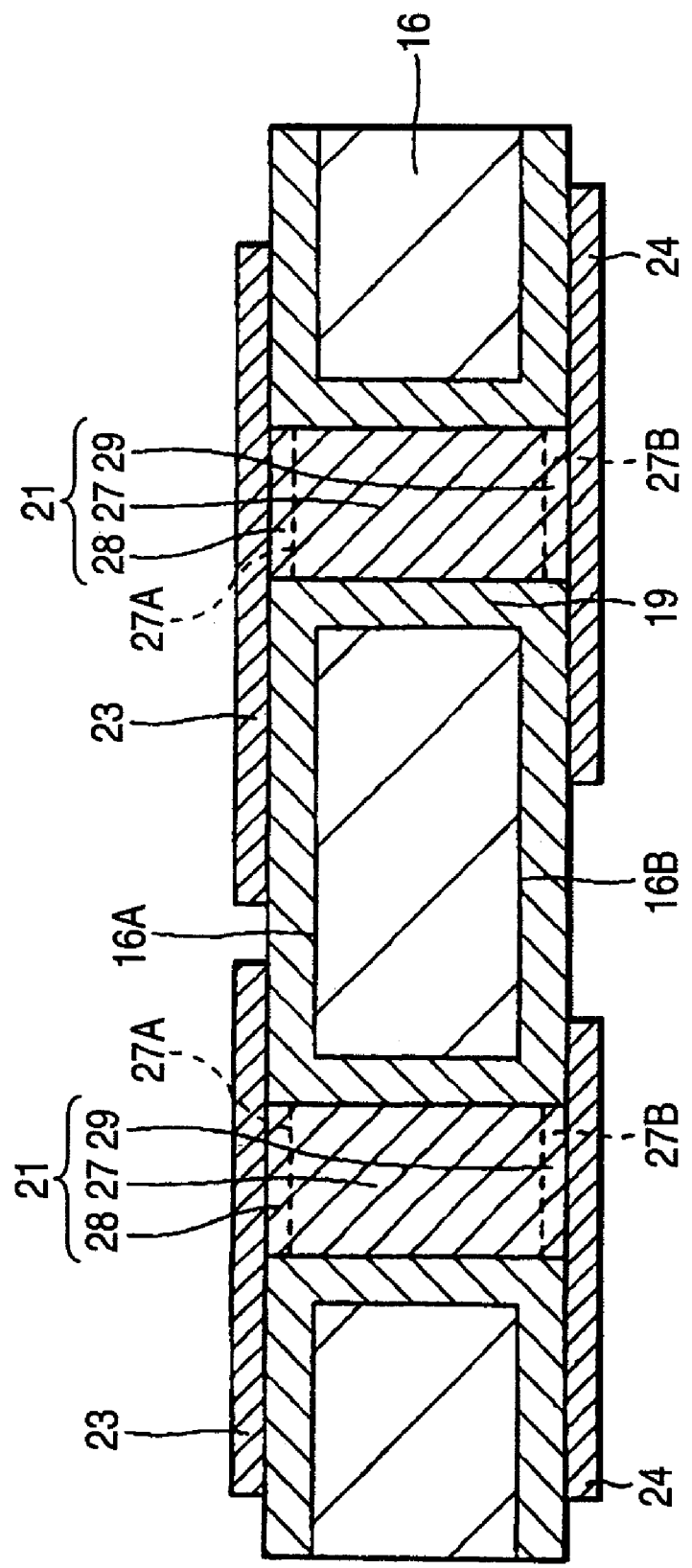
FIG. 7 is a view (#5) showing steps of manufacturing the wiring substrate according to the first embodiment of the present invention.

Then, in steps shown in FIG. 7, the first wiring pattern 23 is formed on the upper surface side of the structure shown in FIG. 6 to contact the first projection portion 28 and the insulating film 19. Also, the second wiring pattern 24 is formed on the lower surface side of the structure shown in FIG. 6 to contact the second projection portion 29 and the insulating film 19. As the first wiring pattern 23, for example, the multilayer film constructed by forming in sequence a Ti film (e.g., thickness of 0.1 µm) formed by the sputter method, a Cu film (e.g., thickness of 0.5 µm) formed by the sputter method, a Cu film (e.g., thickness of 3.0 µm) formed by the plating method, a Ni film (e.g., thickness of 3.0 µm) formed by the plating method, and an Au film (e.g., thickness of 0.5 µm) formed by the plating method on the first projection portion 28 can be used.

Also, as the second wiring pattern 24, for example, the multilayer film constructed by forming in sequence a Ti film (e.g., thickness of 0.1 µm) formed by the sputter method, a Cu film (e.g., thickness of 0.5 µm) formed by the sputter method, a Cu film (e.g., thickness of 3.0 µm) formed by the plating method, a Ni film (e.g., thickness of 3.0 µm) formed by the plating method, and an Au film (e.g., thickness of 0.5 µm) formed by the plating method on the lower surface of the second projection portion 29 can be used.

The first and second wiring patterns 23, 24 constructed as above can be formed by the semi-additive process, for example. Concretely, the first wiring pattern 23 is formed as follows. Firstly, a Ti/Cu multilayer film is formed by forming sequentially a Ti film (e.g., thickness of 0.1 µm) and a Cu film (e.g., thickness of 0.5 µm) on the first projection portion 28. Then, a resist film (not shown) having an opening portion in an area corresponding to the forming area of the first wiring pattern 23 is formed on the Ti/Cu multilayer film. Then, a Cu film (e.g., thickness of 3.0 µm), a Ni film (e.g., thickness of 3.0 µm), and an Au film (e.g., thickness of 0.5 µm) are formed sequentially on the Ti/Cu multilayer film by the electroplating method using the Ti/Cu multilayer film as a power feeding layer. Finally, the resist film (not shown) and portions of the Ti/Cu multilayer film covered with resist film (not shown) are removed. Also, the second wiring pattern 24 can be formed by the similar approach to that of the first wiring pattern 23.

Figure 8:
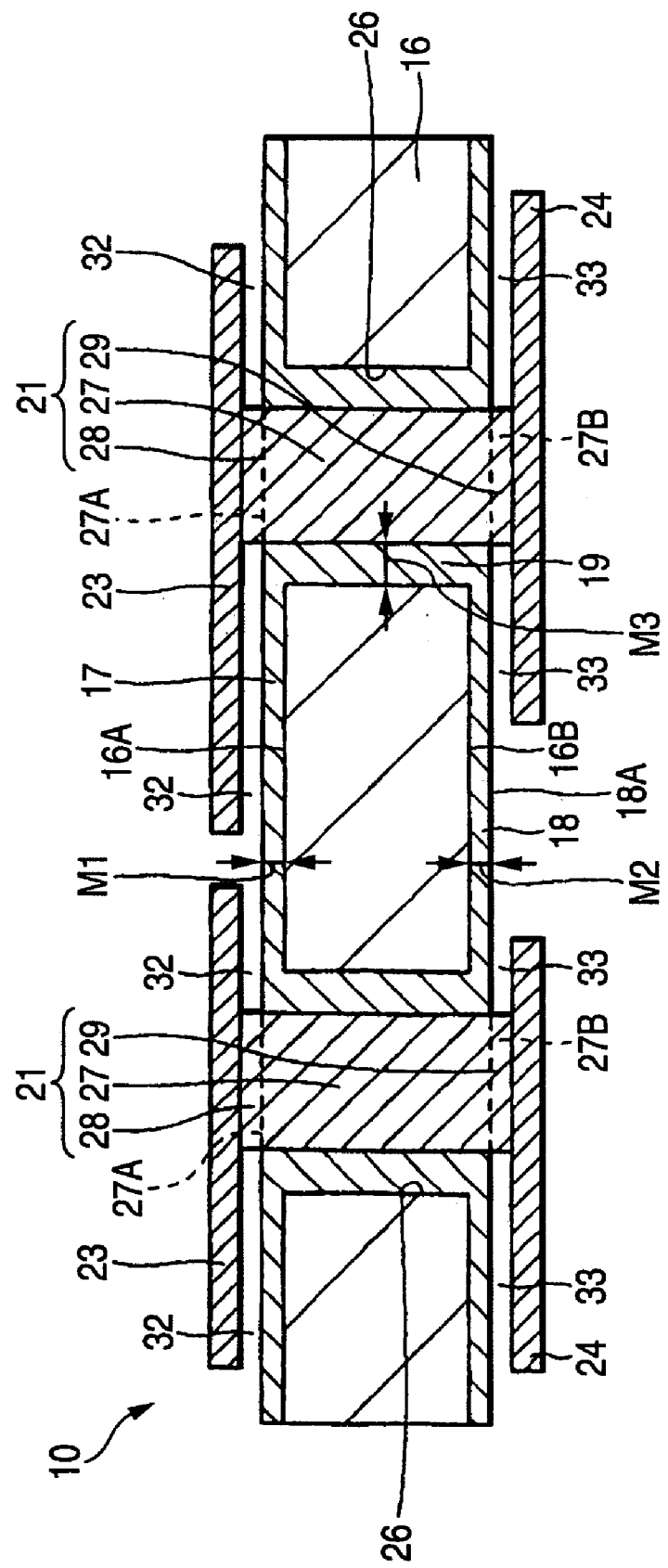
FIG. 8 is a view (#6) showing steps of manufacturing the wiring substrate according to the first embodiment of the present invention.

Then, in steps shown in FIG. 8, the first and second insulating films 17, 18 are formed by etching the insulating film 19 formed on the upper surface 16A and the lower surface 16B of the semiconductor substrate 16 shown in FIG. 7 respectively. Also, the air gap 32 is formed between the insulating film 17 and the first wiring pattern 23, and the air gap 33 is formed between the insulating film 18 and the second wiring pattern 24. Thus, the wiring substrate 10 of the first embodiment is manufactured. When a thickness M3 of the insulating film 19 shown in FIG. 7 is set to 2 µm, a thickness M1 of the insulating film 17 can be set to 1 µm, for example. In this case, a thickness M2 of the second wiring pattern 18 can be set to 1 µm, for example.

Second Embodiment

Figure 9:
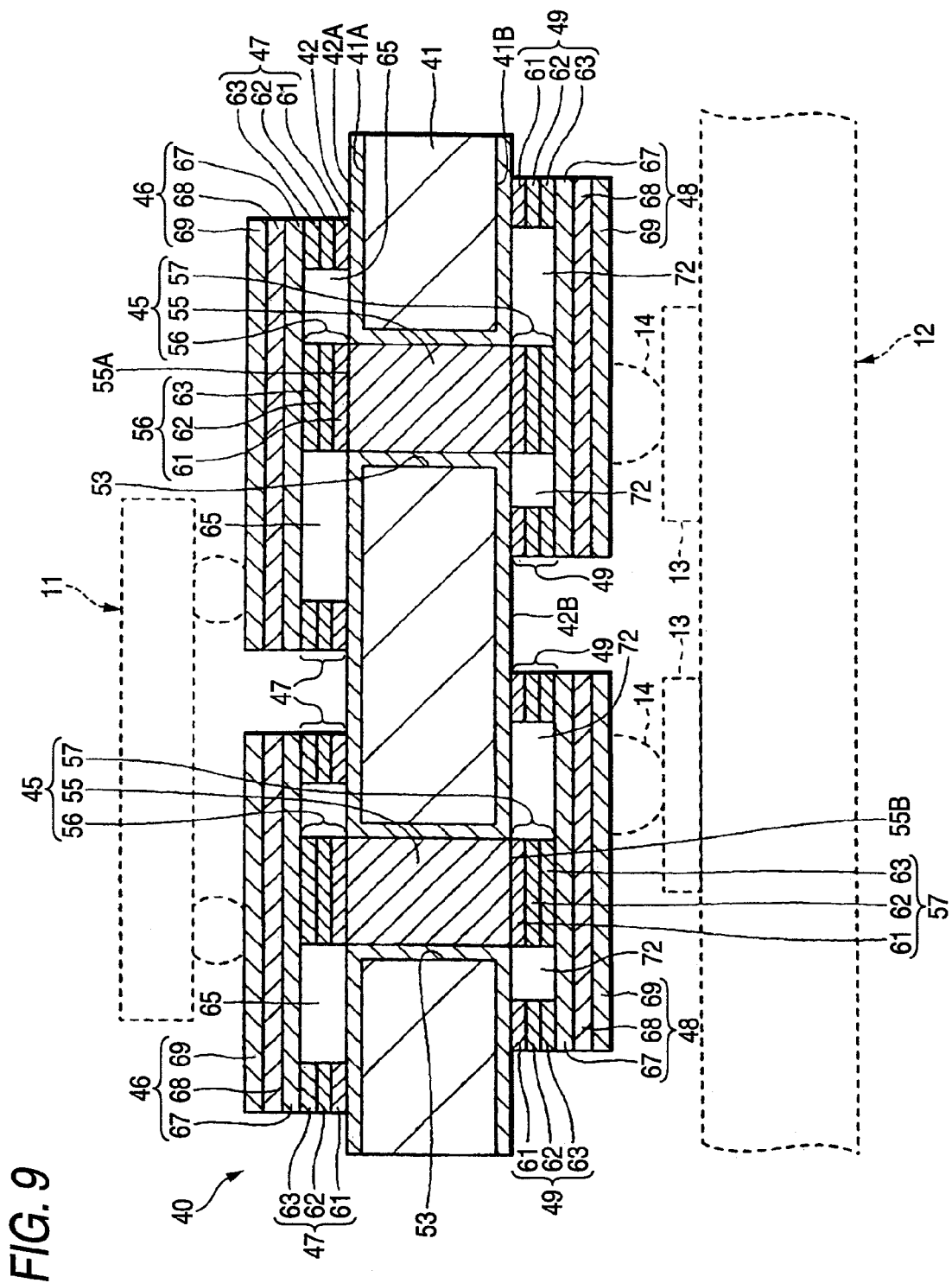
FIG. 9 is a sectional view of a wiring substrate according to a second embodiment of the present invention.

FIG. 9 is a sectional view of a wiring substrate according to a second embodiment of the present invention. In FIG. 9, the same reference symbols are affixed to the same constituent portions as those of the structure shown in FIG. 2.

By reference to FIG. 9, a wiring substrate 40 of the second embodiment includes a semiconductor substrate 41, an insulating film 42, through electrodes 45, first wiring patterns 46, first supporting members 47, second wiring patterns 48, and second supporting members 49.

The semiconductor substrate 41 is formed like a plate. Through holes 53 are formed in the semiconductor substrate 41. As the semiconductor substrate 41, a silicon substrate can be used, for example. When the silicon substrate is used as the semiconductor substrate 41, a thickness of the silicon substrate 41 can be set to 200 µm, for example.

The insulating film 42 is provided to cover an upper surface 41A of the semiconductor substrate 41, a lower surface 41B of the semiconductor substrate 41, and surfaces of the semiconductor substrate 41, which are exposed from the through holes 53. When the silicon substrate is used as the semiconductor substrate 41, a thermal oxide film formed by thermally oxidizing the silicon substrate, for example, can be used as the insulating film 42. A thickness of the insulating film 42 can be set to 1 µm, for example. A dielectric constant of the insulating film 42 is larger than a dielectric constant of the air and is about 3.8.

The through electrode 45 is used to connect electrically the first wiring pattern 46 and the second wiring pattern 48. The through electrode 45 has a through electrode main body 55, a first projection portion 56, and a second projection portion 57. The through electrode main body 55 is provided in the through holes 53 on which the insulating film 42 is formed. An upper end surface 55A of the through electrode main body 55 is formed to be in the same plane as an upper surface 42A of the insulating film 42 that is formed on the upper surface 41A side of the semiconductor substrate 41. A lower end surface 55B of the through electrode main body 55 is formed to be in the same plane as a lower surface 42B of the insulating film 42 that is formed on the lower surface 41B side of the semiconductor substrate 41. As a material of the through electrode main body 55, for example, Cu can be used.

The first projection portion 56 is provided on the upper end surface 55A of the through electrode main body 55 to project from the insulating film 42. The first projection portion 56 is constructed by forming sequentially a Ti film 61 formed by the sputter method, a Cu film 62 formed by the sputter method, and a Cu film 63 formed by the plating method on the upper end surface 55A of the through electrode main body 55. The first wiring pattern 46 connected to the electronic component 11 is provided on the Cu film 63. A thickness of the first projection portion 56 can be set to 5.6 μm, for example. In this case, as respective thicknesses of the films constituting the first projection portion 56, for example, a thickness of the Ti film 61 can be set to 0.1 μm, thickness of the Cu film 62 can be set to 0.5 μm, and thickness of the Cu film 63 can be set to 5 μm.

The first projection portion 56 constructed as above is provided such that an air whose dielectric constant (concretely, 1.0) is smaller than a dielectric constant (concretely, 3.8) of the insulating film 42 is interposed between the insulating film 42 and the first wiring pattern 46 by forming a air gap 65 (a first air gap) between the insulating film 42 and the first wiring pattern 46. That is, the first projection portion 56 is provided to improve a transmission speed of the signal transmitted between the electronic component 11 and the mounting substrate 12. A size of the air gap 65 can be set substantially equal to a thickness of the first projection portion 56, for example. A thickness of the first projection portion 56 can be set to 5.6 μm, for example.

The first wiring pattern 46 is provided on the first projection portion 56 in a state that the air gap 65 (the first air gap) is interposed between this first wiring pattern 46 and the insulating film 42. The first wiring pattern 46 is constructed by forming sequentially a Cu film 67, a Ni film 68, and an Au film 69 connected to the electronic component 11 on the first projection portion 56. The first wiring pattern 46 is connected to the electronic component 11 and also is connected electrically to the second wiring pattern 48 via the through electrode 45. The Cu film 67, the Ni film 68, and the Au film 69 can be formed by the plating method, for example. A thickness of the Cu film 67 can be set to 5 μm, for example. A thickness of the Ni film 68 can be set to 3 μm, for example. Also, a thickness of the Au film 69 can be set to 0.1 μm, for example.

A plurality of first supporting members 47 are provided on portions of the insulating film 42 that faces portions of the first wiring pattern 46 which are positioned away from the first projection portion 56. The upper end of the first supporting member 47 contacts the first wiring pattern 46. A thickness of the first supporting member 47 can be set substantially equal to that of the first projection portion 56. The first supporting member 47 is used to support the first wiring pattern 46.

In this manner, the first supporting member 47 supports the first wiring pattern 46 and the thickness of the first supporting member 47 is set substantially equal to that of the first projection portion 56. Also, the first supporting member 47 is provided on portions of the insulating film 42 that faces portions of the first wiring pattern 46 which are positioned away from the first projection portion 56. Therefore, a deformation (concretely, a warp, for example) of the first wiring pattern 46 can be suppressed. As a result, a size of the air gap 65 provided between the first wiring pattern 46 and the insulating film 42 can be substantially uniform.

Also, the first supporting members 47 may be provided between the portion of the first wiring pattern 46, to which the electronic component 11 is connected, and the insulating film 42.

In this manner, the first supporting members 47 are provided between the portion of the first wiring pattern 46, to which the electronic component 11 is connected, and the insulating film 42. Therefore, in mounting the electronic component 11 on the first wiring pattern 46, deformation of the first wiring pattern 46 can be suppressed. As a result, the electronic component 11 can be connected (mounted) to the first wiring pattern 46 with good precision.

The second projection portion 57 is provided on the lower end surface 55B of the through electrode main body 55 to project from the insulating film 42. The second projection portion 57 is constructed similarly to the first projection portion 56. Concretely, the second projection portion 57 is constructed by forming sequentially a Ti film 61 (e.g., thickness of 0.1 μm) formed by the sputter method, a Cu film 62 (e.g., thickness of 0.5 μm) formed by the sputter method, and a Cu film 63 (e.g., thickness of 5 μm) formed by the plating method on the lower end surface 55B of the through electrode main body 55. The second wiring pattern 48 is provided on the Cu film 63 of the second projection portion 57 and is connected electrically to the mounting substrate 12 via the external connection terminal 14. Accordingly, a air gap 72 (a second air gap) is formed between the second wiring pattern 48 and the insulating film 42 provided on the lower surface 41B of the semiconductor substrate 41.

In the second projection portion 57 constructed as above, an air whose dielectric constant (concretely, 1.0) is smaller than a dielectric constant (concretely, 3.8) of the insulating film 42 is interposed between the insulating film 42 and the second wiring pattern 47 by forming the air gap 72 (the second air gap) between the insulating film 42 and the second wiring pattern 47. That is, the first projection portion 57 is provided to improve a transmission speed of the signal transmitted between the electronic component 11 and the mounting substrate 12 and also to improve reliability of the electrical connection between the wiring substrate 40 and the mounting substrate 12 by relaxing a difference of coefficient of thermal expansion between the mounting substrate 12 and the wiring substrate 40.

The second wiring pattern 48 is provided on the lower end of the second projection portion 57 in a state that the air gap 72 is interposed between this second wiring pattern 48 and the insulating film 42. The second wiring pattern 48 is connected electrically to the second projection portion 57. The second wiring pattern 48 is constructed similarly to the first wiring pattern 46. Concretely, the second wiring pattern 48 is constructed by forming sequentially a Cu film 67 (e.g., thickness of 5 μm) formed by the plating method, a Ni film 68 (e.g., thickness of 3 μm) formed by the plating method, and an Au film 69 (e.g., thickness of 0.1 μm) formed by the plating method on the lower surface of the second projection portion 57 (concretely, the lower surface of the Cu film 63 constituting the second projection portion 57). Also, the Au film 69 is connected electrically to the pad 13 provided on the mounting substrate 12 via the external connection terminal 14.

A plurality of second supporting members 49 are provided on portions of the insulating film 42 that faces portions of the second wiring pattern 48 which are positioned away from the second projection portion 57. The lower end of the second supporting member 49 contacts the second wiring pattern 48. A thickness of the second supporting member 49 can be set substantially equal to that of the second projection portion 57. The second supporting member 49 is used to support the second wiring pattern 48.

In this manner, the second supporting member 49 supports the second wiring pattern 48 and the thickness of the second supporting member 49 is set substantially equal to that of the second projection portion 57. Also, the second supporting member 49 is provided on portions of the insulating film 42 that faces portions of the second wiring pattern 48 which are positioned away from the second projection portion 57. Therefore, deformation (concretely, a warp, for example) of the second wiring pattern 48 can be suppressed. As a result, a size of the air gap 72 provided between the second wiring pattern 48 and the insulating film 42 can be substantially uniform.

Also, the second supporting members 49 may be provided between the portions of the second wiring pattern 48, on which the external connection terminals 14 are provided, and the insulating film 42.

In this manner, the second supporting member 49 supports the second wiring pattern 48 and the thickness of the second supporting member 49 is set substantially equal to that of the second projection portion 57. Also, the second supporting member 49 is provided on portions of the insulating film 42 that faces portions of the second wiring pattern 48 which are positioned away from the second projection portion 57. Therefore, in mounting the wiring substrate 40 on the mounting substrate 12, deformation of the second wiring pattern 48 can be suppressed. As a result, the wiring substrate 40 can be mounted on the mounting substrate 12 with good precision.

According to the wiring substrate of the present embodiment, the first supporting member 47 supports the first wiring pattern 46 and the thickness of the first supporting member 47 is set substantially equal to a that of the first projection portion 56. Also, the first supporting member 47 is provided on portions of the insulating film 42 that faces portions of the first wiring pattern 46 which are positioned away from the first projection portion 56. Furthermore, the second supporting member 49 supports the second wiring pattern 48 and the thickness of the second supporting member 49 is set substantially equal to that of the second projection portion 57. Also, the second supporting member 49 is provided on portions of the insulating film 42 that faces portions of the second wiring pattern 48 which are positioned away from the second projection portion 57. Therefore, deformations of the first and second wiring patterns 46, 48 can be suppressed respectively. As a result, sizes of the air gaps 65, 72 provided between the first and second wiring patterns 46, 48 and the insulating film 42 respectively can be substantially uniform.

Also, the first supporting members 47 are provided between the portion of the first wiring pattern 46, to which the electronic component 11 is connected, and the insulating film 42. Therefore, in mounting the electronic component 11 on the first wiring pattern 46, deformation of the first wiring pattern 46 can be suppressed. As a result, the electronic component 11 can be connected (mounted) to the first wiring pattern 46 with good precision.

In addition, the second supporting members 49 is provided between the portions of the second wiring pattern 48, on which the external connection terminals 14 are provided, and the insulating film 42. Therefore, in mounting the wiring substrate 40 on the mounting substrate 12, deformation of the second wiring pattern 48 can be suppressed. As a result, the wiring substrate 40 can be mounted on the mounting substrate 12 with good precision.

FIG. 10 to FIG. 21 are views showing steps of manufacturing the wiring substrate according to the second embodiment of the present invention. In FIG. 10 to FIG. 21, the same reference symbols are affixed to the same constituent portions as those of the wiring substrate 40 of the second embodiment.

At first, in steps shown in FIG. 10, the semiconductor substrate 41 shaped like a plate is prepared. As the semiconductor substrate 41, for example, the silicon substrate can be used. When the silicon substrate is used as the semiconductor substrate 41, a thickness of the semiconductor substrate 41 can be set to 200 μm, for example.

Then, in steps shown in FIG. 11, the through holes 53 passing through the semiconductor substrate 41 are formed. Concretely, the through holes 53 are formed by etching the semiconductor substrate 41 by anisotropic etching, for example.

Figure 12:
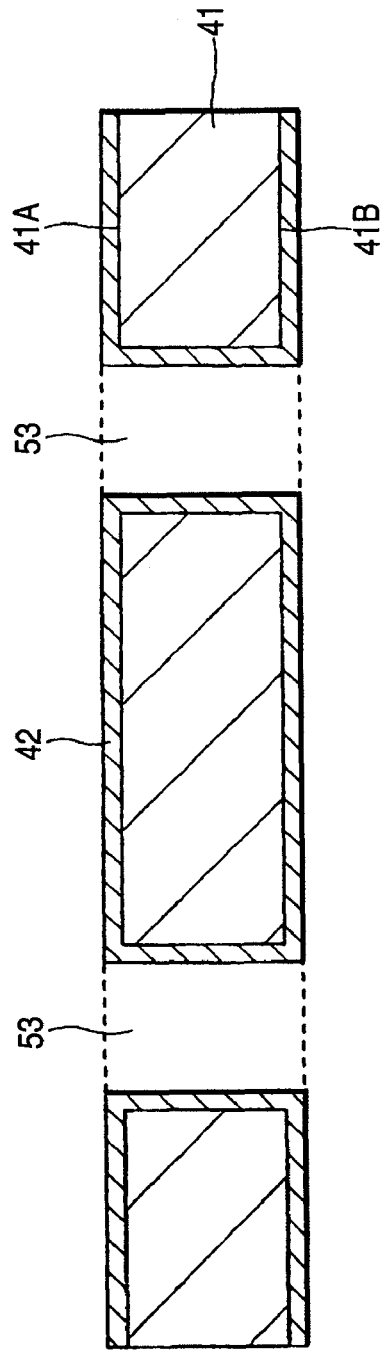
FIG. 12 is a view (#3) showing steps of manufacturing the wiring substrate according to the second embodiment of the present invention.

Then, in steps shown in FIG. 12, the insulating film 42 is formed to cover the upper surface 41A and the lower surface 41B of the semiconductor substrate 41 and surfaces of the semiconductor substrate 41, which are exposed from the through holes 53. Concretely, when the silicon substrate is used as the semiconductor substrate 41, the insulating film 42 (in this case, a thermal oxide film) is formed by thermally oxidizing the semiconductor substrate 41, for example. A thickness of the insulating film 42 can be set to 1 μm, for example. A dielectric constant of the insulating film 42 is larger than a dielectric constant 1.0 of the air and is about 3.8.

Figure 13:
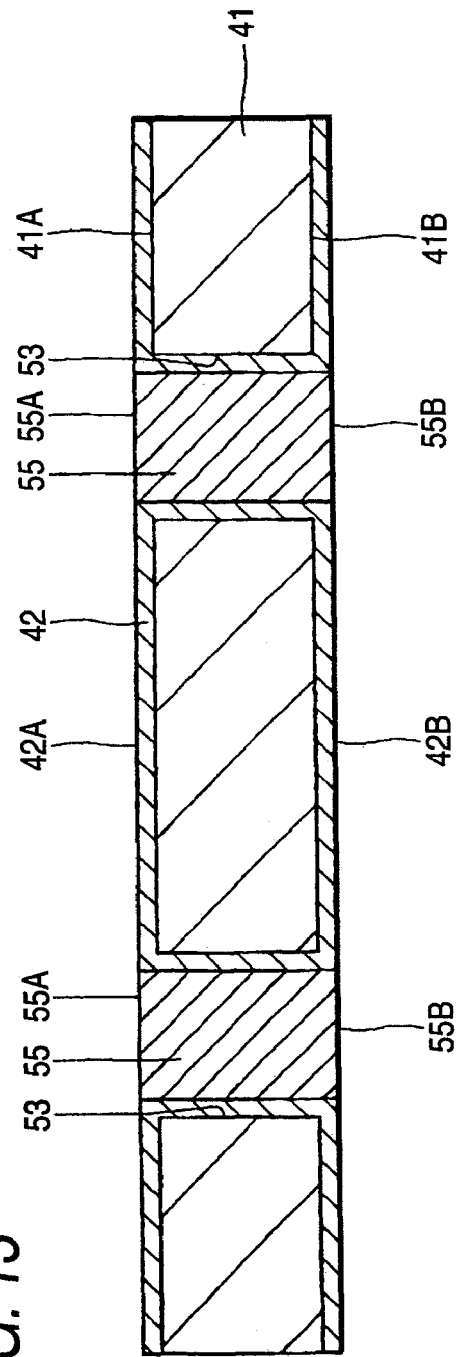
FIG. 13 is a view (#4) showing steps of manufacturing the wiring substrate according to the second embodiment of the present invention.

Then, in steps shown in FIG. 13, the through electrode main body 55 is formed in the through holes 53 on which the insulating film 42 is formed respectively. Concretely, the through electrode main bodies 55 are formed by depositing/growing the Cu plating film in the through holes 53, on which the insulating film 42 is formed, by the plating method. At this time, the upper end surface 55A of the through electrode main body 55 is formed to be in the same plane as an upper surface 42A of the insulating film 42 formed on the upper surface 41A side of the semiconductor substrate 41. Also, the lower end surface 55B of the through electrode main body 55 is formed to be in the same plane as a lower surface 42B of the insulating film 42 formed on the lower surface 41B side of the semiconductor substrate 41.

Figure 14:
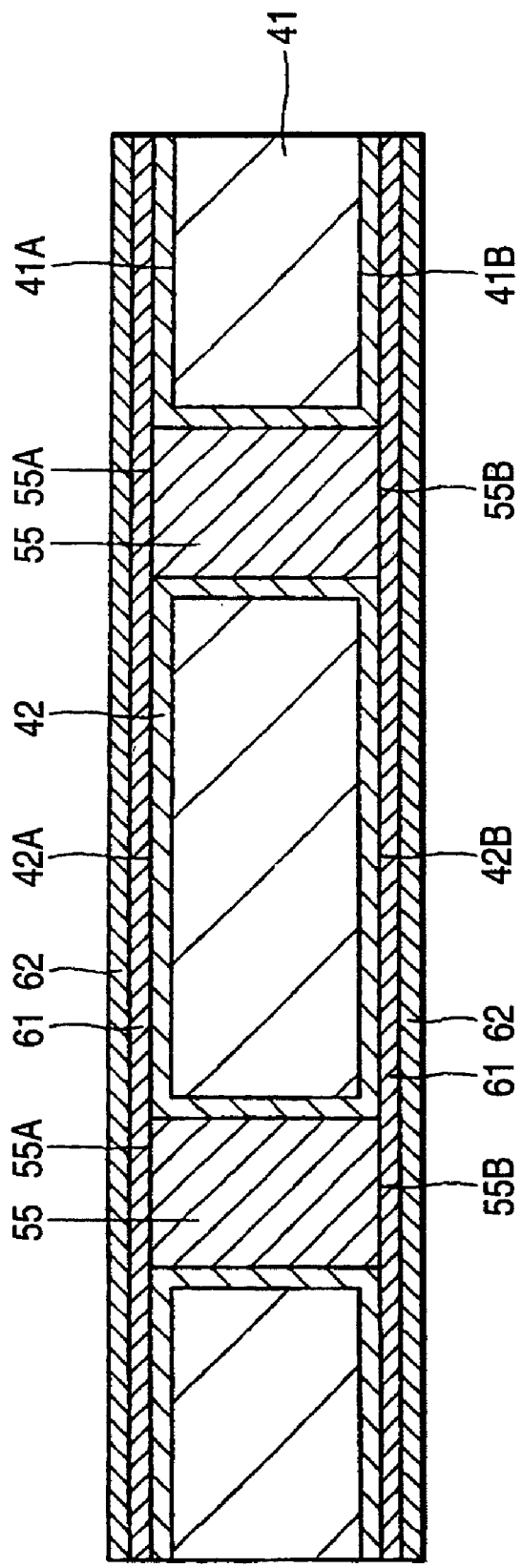
FIG. 14 is a view (#5) showing steps of manufacturing the wiring substrate according to the second embodiment of the present invention.

Then, in steps shown in FIG. 14, the Ti film 61 and the Cu film 62 are formed sequentially to cover the upper surface and the lower surface of the structure shown in FIG. 13. Concretely, the Ti film 61 and the Cu film 62 can be formed by the sputter method, for example. A thickness of the Ti film 61 can be set to 0.1 μm, for example. A thickness of the Au film 69 can be set to 0.5 μm, for example.

Figure 15:
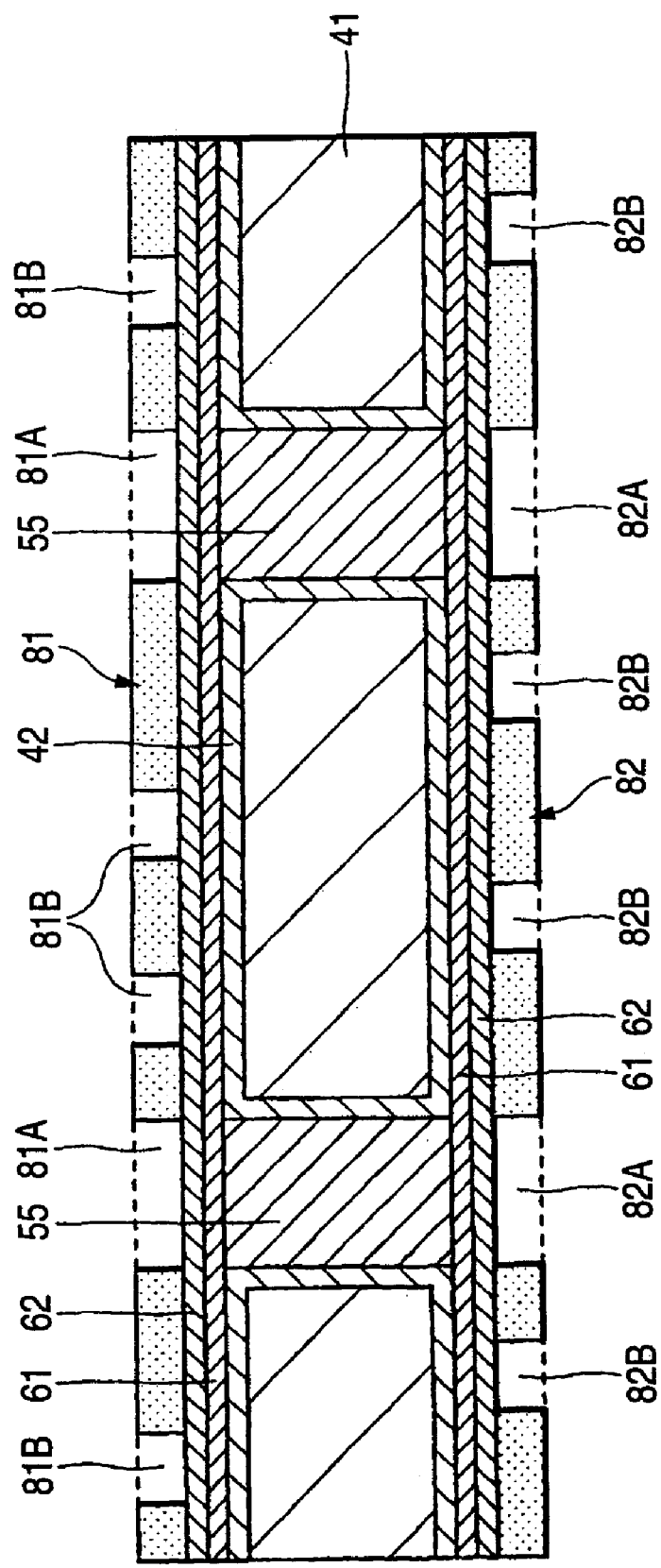
FIG. 15 is a view (#6) showing steps of manufacturing the wiring substrate according to the second embodiment of the present invention.

Then, in steps shown in FIG. 15, a resist film 81 having opening portions 81A, 81B is formed on the upper surface of the structure shown in FIG. 14. Also, a resist film 82 having opening portions 82A, 82B is formed on the lower surface of the structure shown in FIG. 14. The opening portions 81A are formed to expose portions of the Cu film 62 corresponding to the forming areas of the first projection portions 56 described above. Also, the opening portions 81B are formed to expose portions of the Cu film 62 corresponding to the forming areas of the first supporting members 47 described above.

The opening portions 82A are formed to expose portions of the Cu film 62 corresponding to the forming areas of the second projection portions 57 described above. Also, the opening portions 82B are formed to expose portions of the Cu film 62 corresponding to the forming areas of the second supporting members 49 described above.

Figure 16:
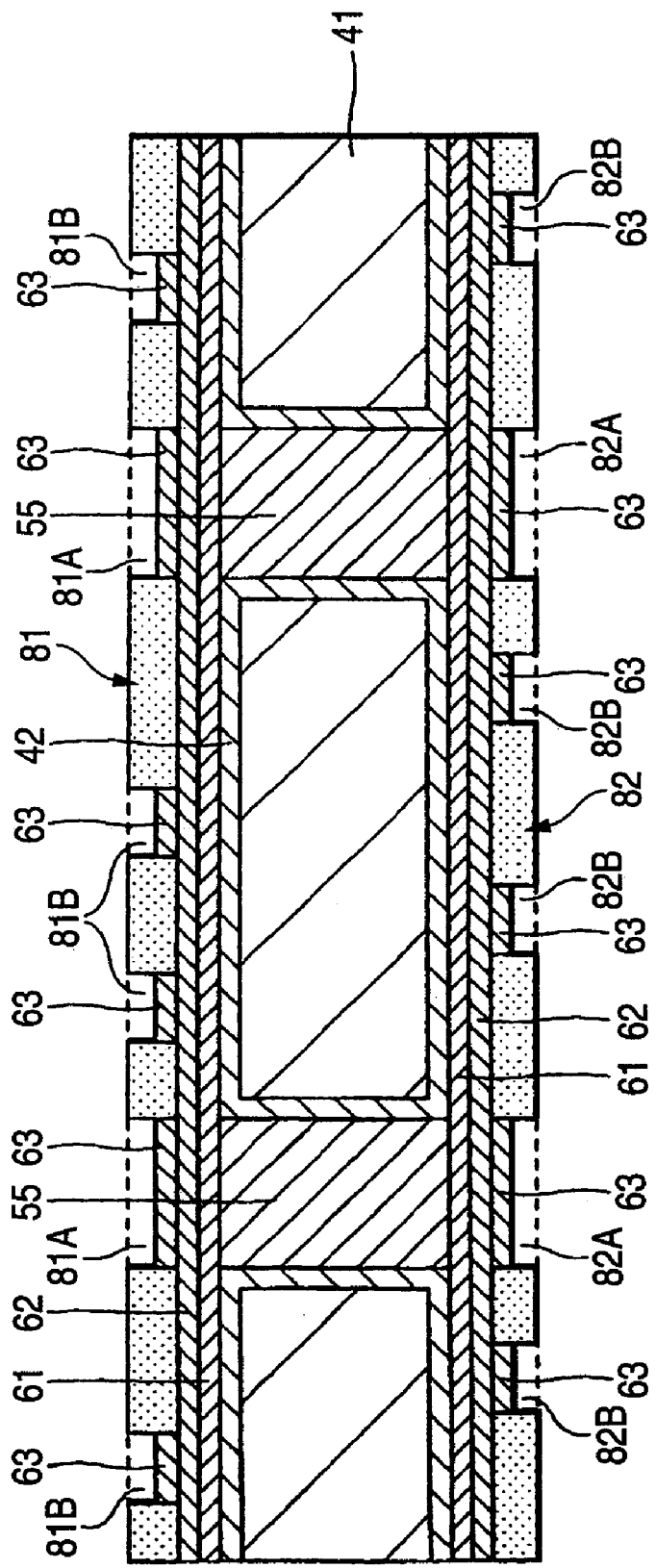
FIG. 16 is a view (#7) showing steps of manufacturing the wiring substrate according to the second embodiment of the present invention.

Then, in steps shown in FIG. 16, the Cu film 63 is formed on portions of the Cu film 62, which are exposed from the opening portions 81A, 81B, 82A, 82B, by the electroplating method using the Cu film 62 as a power feeding layer. A thickness of the Cu film 63 can be set to 5 μm, for example. Then, in steps shown in FIG. 17, the resist films 81, 82 shown in FIG. 16 are removed.

Figure 17:
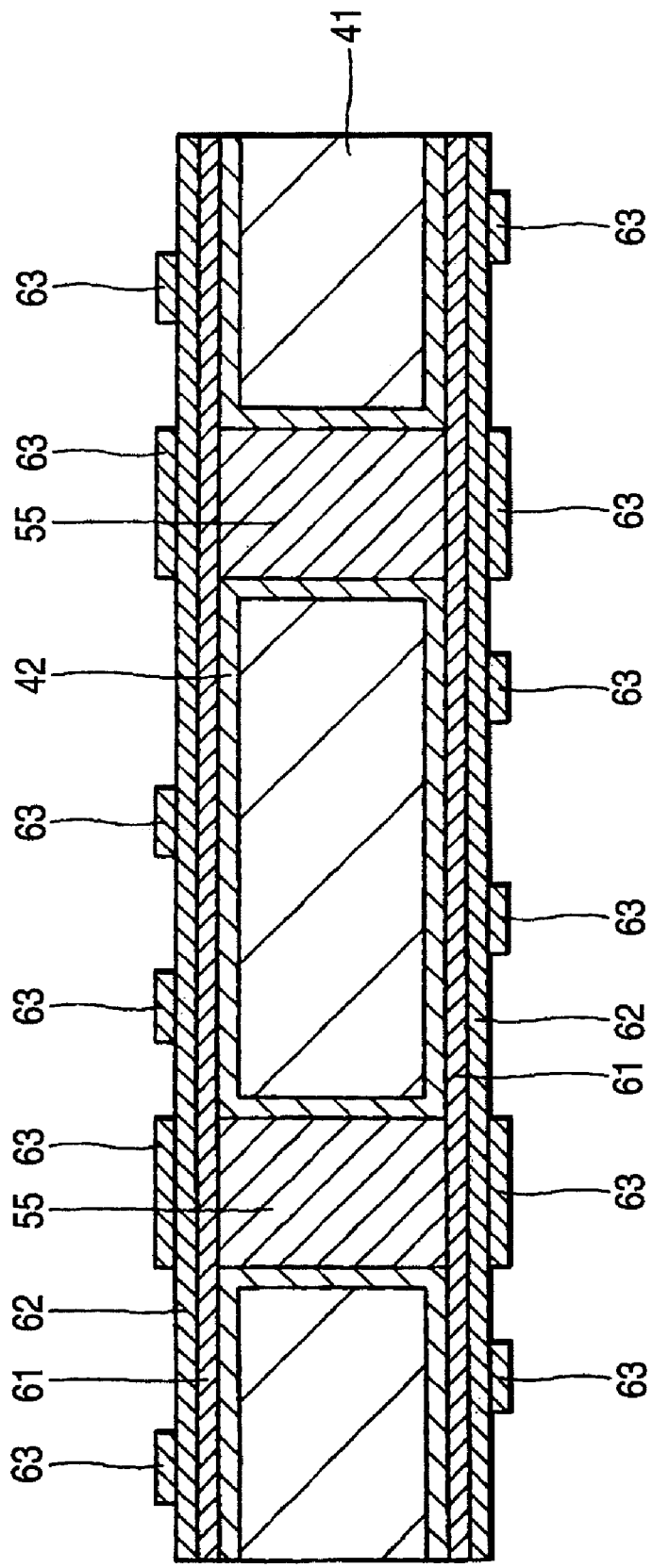
FIG. 17 is a view (#8) showing steps of manufacturing the wiring substrate according to the second embodiment of the present invention.
Figure 18:
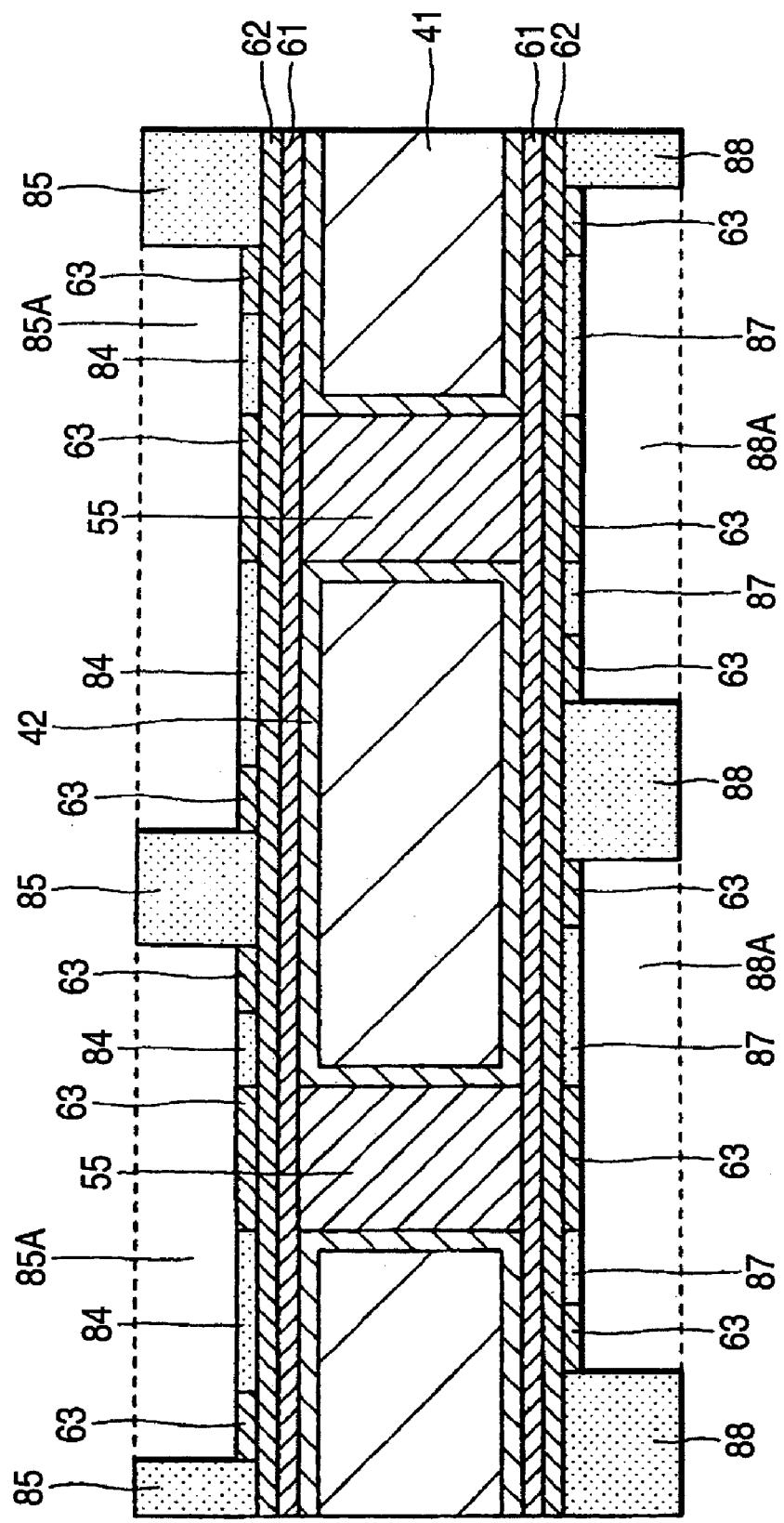
FIG. 18 is a view (#9) showing steps of manufacturing the wiring substrate according to the second embodiment of the present invention.

Then, in steps shown in FIG. 18, a resist film 84 is formed on portions of the Cu film 62, which are positioned between the Cu films 63 formed on the upper surface side of the structure shown in FIG. 17. In this case, an upper surface of the resist film 84 is formed to be in the same plane as an upper surface of the Cu film 63. Also, a resist film 85 having opening portions 85A is formed on portions of the Cu film 62 on the upper surface side of the structure shown in FIG. 17. Also, in steps shown in FIG. 18, a resist film 87 is formed on portions of the Cu film 62, which are positioned between the Cu films 63 formed on the lower surface side of the structure shown in FIG. 17. In this case, an lower surface of the resist film 87 is formed to be in the same plane as a lower surface of the Cu film 63. Also, a resist film 88 having opening portions 88A is formed in portions of the Cu film 62 positioned on the lower surface side of the structure shown in FIG. 17. The opening portions 85A are formed to expose the forming areas of the first wiring patterns 46, and the opening portions 88A are formed to expose the forming areas of the second wiring patterns 48.

Figure 19:
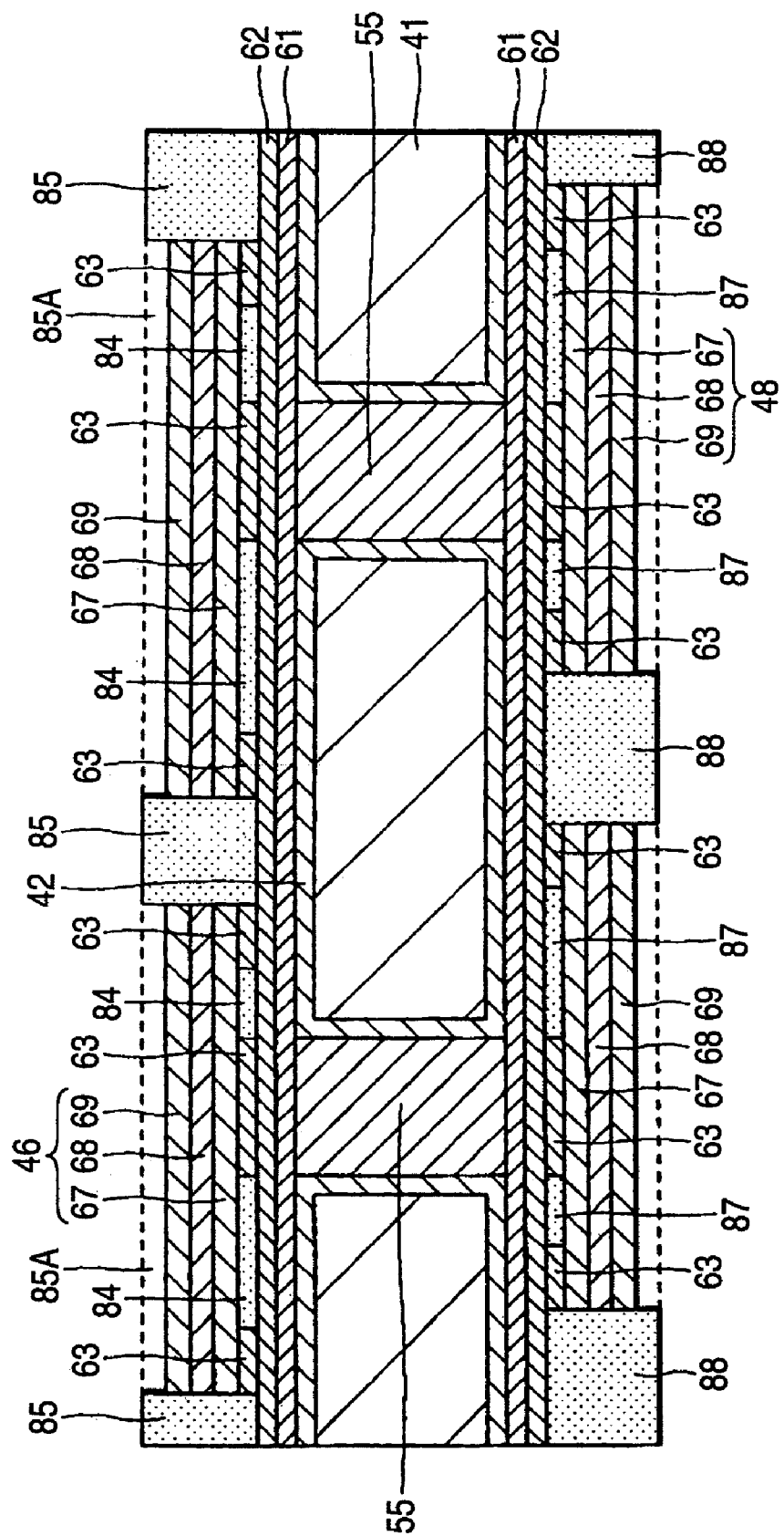
FIG. 19 is a view (#10) showing steps of manufacturing the wiring substrate according to the second embodiment of the present invention.

Then, in steps shown in FIG. 19, the Cu film 67, the Ni film 68, and the Au film 69 are formed sequentially on the Cu film 63 and the resist film 84 provided on the upper surface side of the structure shown in FIG. 18. Also, the Cu film 67, the Ni film 68, and the Au film 69 are formed sequentially on the lower surface of the Cu film 63 and the lower surface of the resist film 87 provided on the lower surface side of the structure shown in FIG. 18. Concretely, the Cu film 67, the Ni film 68, and the Au film 69 are formed by the electroplating method using the Cu film 62 as a power feeding layer, for example. Accordingly, the first wiring pattern 46 consisting of the Cu film 67, the Ni film 68, and the Au film 69 is formed on the upper surface side of the structure shown in FIG. 19, and also the second wiring pattern 48 consisting of the Cu film 67, the Ni film 68, and the Au film 69 is formed on the lower surface side of the structure shown in FIG. 19.

Figure 20:
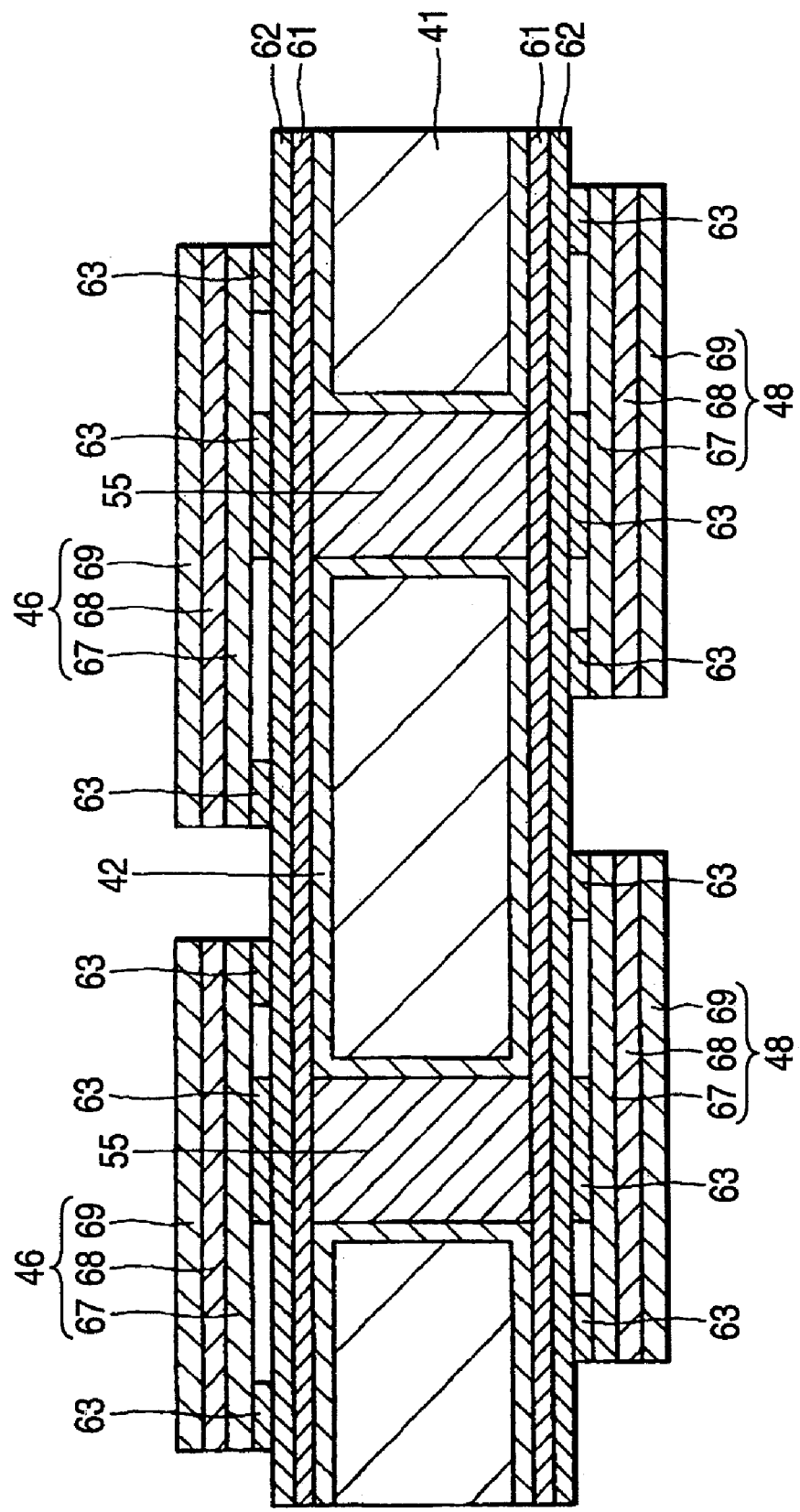
FIG. 20 is a view (#11) showing steps of manufacturing the wiring substrate according to the second embodiment of the present invention.
Figure 21:
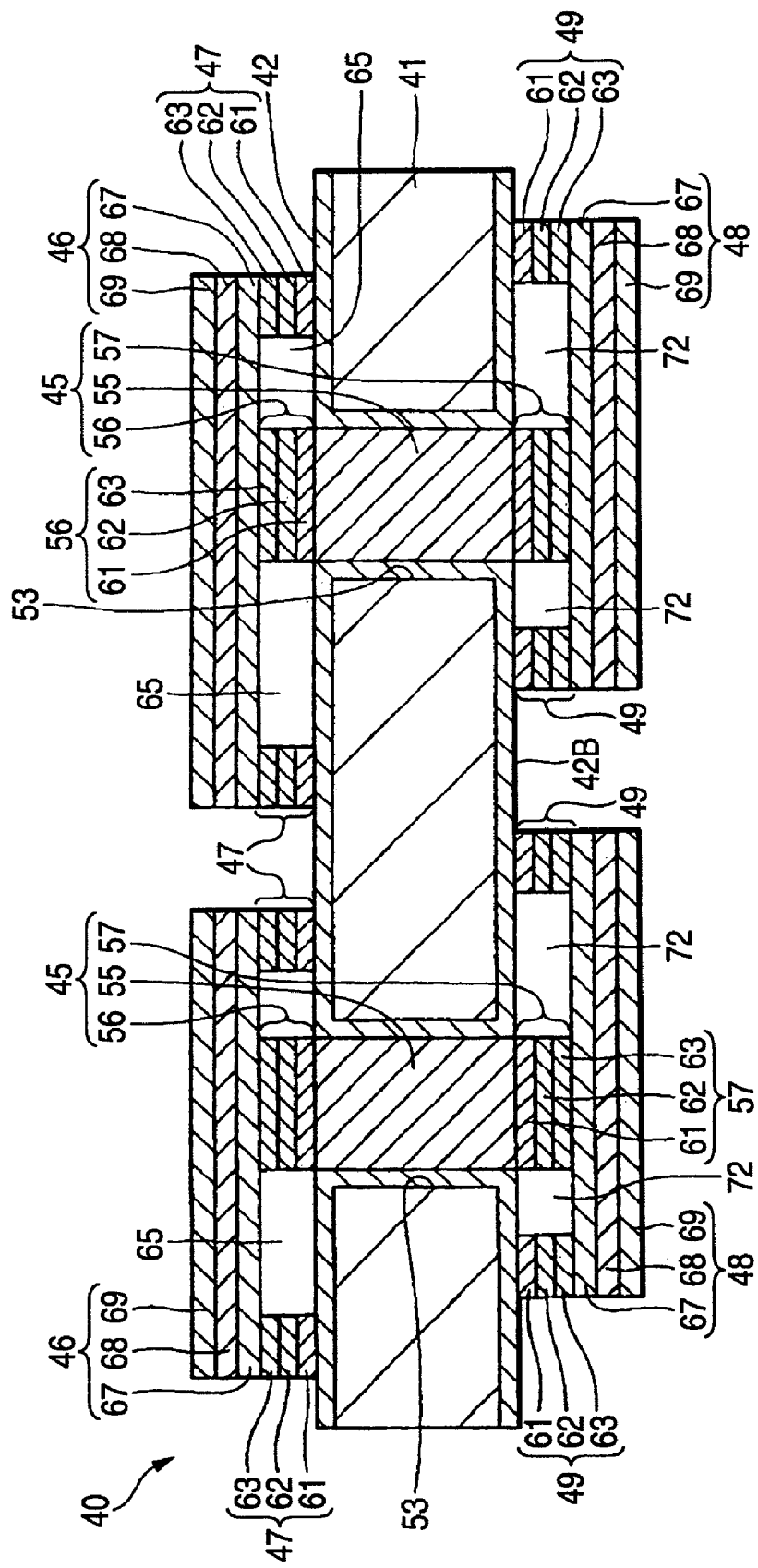
FIG. 21 is a view (#12) showing steps of manufacturing the wiring substrate according to the second embodiment of the present invention.

Then, in steps shown in FIG. 20, the resist films 84, 85, 87, 88 are removed. Then, in steps shown in FIG. 21, by removing the Cu film 62, which are not covered with the Cu film 63 provided to the structure shown in FIG. 20, and the Ti film 61, which are covered with the Cu film 62 which are not covered with the Cu film 63, the first and second supporting members 47, 49, the first and second projection portions 56, 57, and the air gaps 65, 72 are formed. As a result, the wiring substrate 40 of the second embodiment is manufactured.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A wiring substrate, comprising:
    a semiconductor substrate having a through hole;
    an insulating film provided to cover an upper surface, a lower surface and a first surface of the semiconductor substrate, the first surface corresponding to a side surface of the through hole;
    a through electrode extending through the through hole, the through electrode including a main body disposed in the through hole, a first projection portion projecting from the insulating film formed on the upper surface of the semiconductor substrate, and a second projection portion projecting from the insulating film formed on the lower surface of the semiconductor substrate, the main body, first projection portion, and the second projection portion being integrally formed, having a constant width, and forming a continuous side surface of the through electrode;
    a first wiring pattern disposed on an upper surface side of the semiconductor substrate and coupled to the first projection portion of the through electrode, and supported by the first projection portion; and
    a second wiring pattern disposed on a lower surface side of the semiconductor substrate and coupled to the second projection portion of the through electrode, and supported by the second projection portion,
    wherein a first air gap is confined by the first wiring pattern, the side surface of the through electrode, and the insulating film formed on the upper surface of the semiconductor substrate, and
    a second air gap is confined by the second wiring pattern, the side surface of the through electrode, and the insulating film formed on the lower surface of the semiconductor substrate.

2. The wiring substrate according to claim 1, further comprising:
    a first supporting member coupling the first wiring pattern and the insulating film formed on the upper surface of the semiconductor substrate to support the first wiring pattern, the first supporting member further confining the first air gap along with the first wiring pattern, the side surface of the through electrode, and the insulating film formed on the upper surface of the semiconductor substrate.

3. The wiring substrate according to claim 2, wherein a thickness of the first supporting member is substantially equal to that of the first projection portion.

4. The wiring substrate according to claim 3, wherein the first projection portion is provided in plural.

5. The wiring substrate according to claim 4, further comprising:
    a second supporting member coupling the second wiring pattern and the insulating film formed on the lower surface of the semiconductor substrate to support the second wiring pattern, the second supporting member further confining the second air gap along with the second wiring pattern, the side surface of the through electrode, and the insulating film formed on the lower surface of the semiconductor substrate.

6. The wiring substrate according to claim 5, wherein a thickness of the second supporting member is substantially equal to that of the second projection portion.

7. The wiring substrate according to claim 6, wherein the second projection portion is provided in plural.

8. A semiconductor device comprising:
    the wiring substrate according to claim 1; and
    an electronic component coupled to the first wiring pattern.

9. The semiconductor device according to claim 8, further comprising:
    a mounting substrate coupled to the second wiring pattern.

* * * * *